United States Patent [19]
Tsai et al.

[11] Patent Number: 6,041,092
[45] Date of Patent: Mar. 21, 2000

[54] DIGITAL CIRCUIT TO COUNT LIKE SIGNALS IN A DATA WORD

[75] Inventors: Li C. Tsai; Richard M. Blumberg, both of Fort Collins, Colo.

[73] Assignee: Hewlett-Packard Company, Palo Alto, Calif.

[21] Appl. No.: 09/183,311

[22] Filed: Oct. 30, 1998

[51] Int. Cl.[7] .................................................. G06M 3/00
[52] U.S. Cl. .................................. 377/1; 372/12; 372/13; 340/146.2
[58] Field of Search ............................. 340/146.2; 377/1, 377/12, 13

[56] References Cited

U.S. PATENT DOCUMENTS

| | | | |
|---|---|---|---|
| 4,043,671 | 8/1977 | Goodwin | 356/358 |
| 5,572,682 | 11/1996 | Garibays, Jr. et al. | 711/137 |

*Primary Examiner*—Margaret R. Wambach

[57] ABSTRACT

A digital circuit for counting the number of zeroes or ones in a data word comprising a plurality of series paths leading to one-hot encoded outputs. Each one-hot encoded output indicates a different number of like signals in the input data word. One of the plurality of series paths is activated by connecting the series path from an input power rail to the one-hot output. A series path is connected through a plurality of transfer gates, each controlled by either a single bit of the input data word or its complement. The series paths may be optimized to share transfer gates by interconnecting them in a tree or lattice structure. Subsections of the input data word may be counted separately in independent tree or lattice structures, then combined in subsequent combinational stages of the circuit. The resulting one-hot encoded count of like signals may then be binary encoded by a final stage of the counting circuit.

23 Claims, 7 Drawing Sheets

DIGITAL CIRCUIT TO COUNT LIKE SIGNALS IN A DATA WORD

FIELD OF THE INVENTION

The present invention relates generally to the field of digital circuits, and more particularly, to a system and method for counting the number of either ones or zeros in a data word.

BACKGROUND OF THE INVENTION

Data is stored and manipulated in digital computer processors in binary form. Binary data consists of a series of digits, either 0 or 1, which represent numbers in the binary, or base two, number system. Binary data is generally divided into data words, numbers which may have various lengths such as 8 digits, or bits. Typical lengths for data words in digital computers include 4, 8, 16, 32, 64 or 128 bits.

Binary data is often scrambled, or encrypted, to keep it secure and private. A data encryption algorithm is applied to the target data to scramble the data into an unreadable form. The encrypted data can then be restored only by someone with a key, or a number which enables a decryption algorithm to unscramble the data. For example, financial information stored in computers by banks may be encrypted to protect depositor information from tampering. Commercial transactions carried out over e-mail or the Internet may be encrypted. Digital cellular telephone calls may be encrypted to protect the privacy of callers. As digital data becomes more widely used, encryption becomes more critical.

Speed is very important for encryption algorithms. Encryption algorithms comprise complex mathematical formulas which can be slow and complex. Generally, the more secure the encryption algorithm used, the slower it is.

Some data encryption algorithms require a count of like signals in a data word, either the number of ones or the number of zeros. Prior solutions which rely on counters or adders to calculate the number of like signals are limited by the slow operation of the counters or adders. For example, each bit of a data word must be shifted into a counter one by one to count the number of like signals. This process can require multiple clock cycles for every bit that is shifted into the counter, resulting in a delay of tens or even hundreds of clock cycles to calculate the number of like signals in a typical length data word such as 64 bits. If this process takes place in a microprocessor, typically instructions can be carried out in one or only a few clock cycles. In a superscalar microprocessor, multiple instructions can be carried out in only one clock cycle. In either case, the delay required by a counter greatly slows down the execution of an encryption algorithm. Once the microprocessor triggers the calculation of the number of like signals in a data word, it must then wait or move to another task while a counter or adder slowly performs the task.

A need therefore exists for a circuit to rapidly count the number of like signals in a data word in a minimum number of clock cycles. An additional need exists for a circuit which can be extended to count data words of differing lengths, and which can provide a count for selected portions of a data word.

SUMMARY

To assist in achieving the aforementioned needs, the inventors have devised a digital circuit to count the number of like signals in a data word. The circuit may comprise a plurality of series paths from a first signal source to a plurality of one-hot outputs. The first signal source may be connected to an input power rail, either ground or power, Vdd. Each one-hot encoded output indicates a different number of like signals in the input data word.

The plurality of series paths are opened or closed by a plurality of transfer gates placed in series in each series path. A plurality of signal paths comprising a true signal path and a complementary signal path for each bit of an input data word is connected to the control inputs of the transfer gates. Each transfer gate is controlled by a single true signal or complementary signal from the plurality of signal paths which represent the bits of an input data word to be counted. Each series path is controlled by a different subset of the plurality of signal paths to the control inputs of transfer gates. Thus, only one of the plurality of series paths is activated by each state of the input data word. Some of the one-hot outputs are activated by multiple series paths. The multiple series paths having a common ratio of true signal paths to complementary signal paths lead to a common one-hot output.

The series paths may be optimized to share transfer gates by interconnecting them in a tree structure, in which the multiple series paths share common transfer gates if they require common control signals from the plurality of signal paths. After sharing common transfer gates, the series paths diverge when they require different control signals from the plurality of signal paths.

The series paths may also be optimized to share transfer gates by interconnecting them in a lattice structure, in which the multiple series paths share common transfer gates if they require common control signals from the plurality of signal paths. After sharing common transfer gates, the series paths diverge when they require different control signals from the plurality of signal paths. The series paths may reconverge to again share common transfer gates if they again require common control signals from the plurality of signal paths.

Subsections of the input data word may be counted separately in independent series, tree, or lattice structures, then combined in subsequent combinational stages of the circuit. This provides the benefit of producing a count of like signals for subsections of the input data word as well as a count of like signals for the entire input data word.

The resulting one-hot encoded count of like signals may then be binary encoded by a final stage of the counting circuit.

BRIEF DESCRIPTION OF THE DRAWING

An illustrative and presently preferred embodiment of the invention is illustrated in the drawing, in which.

DESCRIPTION OF THE PREFERRED EMBODIMENT

Figure 1:
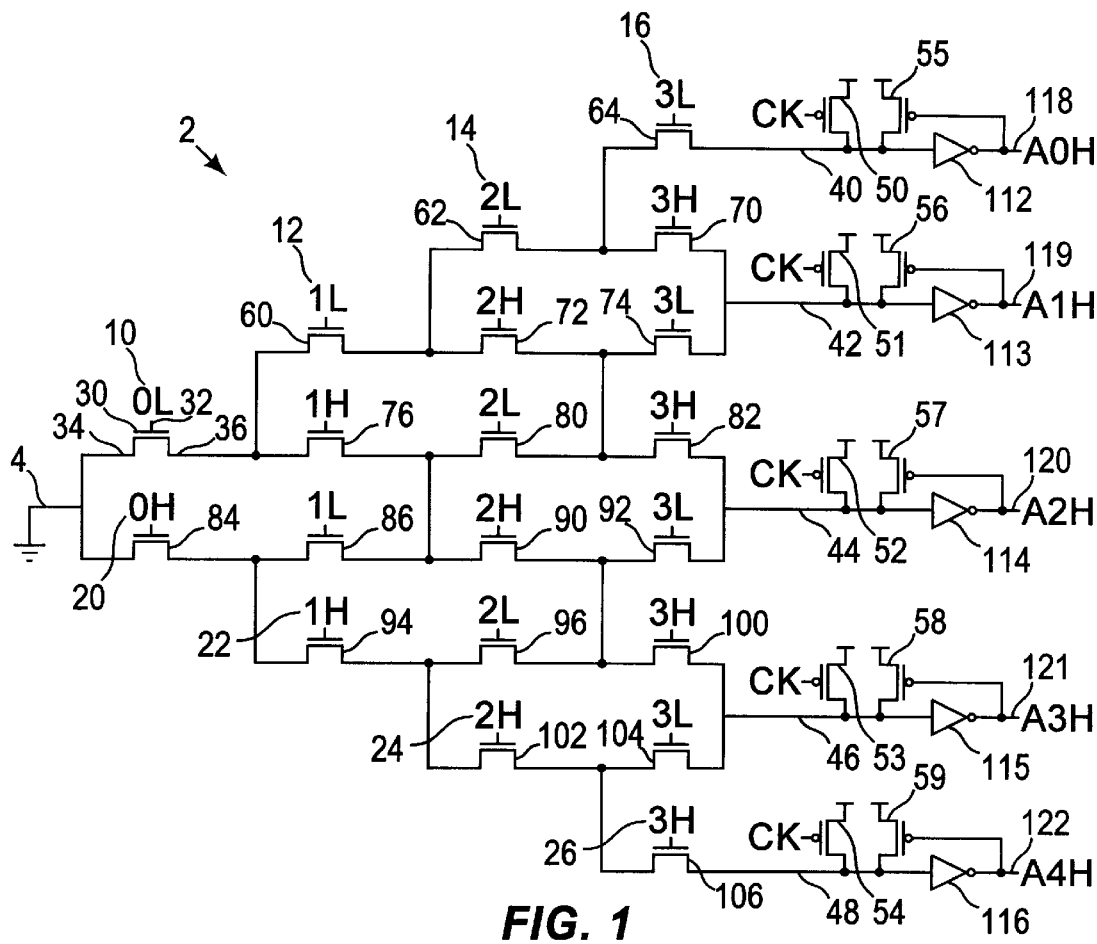
FIG. 1 is a schematic of a lattice structured circuit for producing a one-hot encoded count of like signals in a four bit data word.

A circuit to count the number of like signals in a data word may be used in a computer or in any other data processing system which uses binary data words. The circuit to count like signals may be integrated into the computer or may be connected externally. The circuit may be configured to count either the number of zeroes in the data word, or the number of ones. For example, if a four bit data word contains the number 7, it is represented in the computer in binary form as "0111." A circuit configured to count the number of ones in the four bit data word above will result in 3. A circuit configured to count the number of zeroes in the four bit data word above will result in 1.

The count of like signals may be provided in "one-hot" encoded form, in which a series of output signals are provided, one for each possible number of like signals, ranging from zero to the number of bits in the data word. For each possible number of like signals in the input data word, one of the output signals will be active, and the rest will be inactive.

For example, a circuit to count the number of like signals in a 64 bit data word will provide 65 output signals. If the circuit is configured to count the number of ones in the data word, the first output signal indicates that there are no 1's in the data word. The second output signal indicates that there is one 1, the third that there are 2 1's, etc., and the 65th, or final, output signal indicates that there are 64 1's in the data word. For any given input, only one output is active, and the rest are inactive.

The one-hot encoded output may then be used as is or encoded into binary format or into any other format desired. Furthermore, several encoded outputs may be provided if desired, indicating the number of like signals in the entire input data word and the number of like signals in selected portions of the input data word. For example, a binary encoded output may be provided for the entire 64 bit input data word, another binary encoded output may be provided for the first 32 bits of the 64 bit input data word, and a third binary encoded output may be provided for the last 32 bits of the 64 bit input data word. The outputs provided and the type of encoding applied to the outputs may vary depending upon the requirements of the target system.

In a preferred embodiment the data word is divided into multiple four-bit data words. The number of like signals is counted separately for each four-bit data word in a first stage of the circuit. FIG. 1 illustrates a first stage 2 of a circuit for counting the number of like signals in bits 0–3 of a 64 bit data word. Eight inputs are provided, the four input bits 0–3 (0H 20, 1H 22, 2H 24, and 3H 26), and their complements (0L 10, 1L 12, 2L 14 and 3L 16).

Depending upon the technology employed in the computer or other target system the signals and their complements may be available with no added circuitry. Otherwise, the signal complements may be obtained with inverters.

The actual voltage levels or states of the signals are not important, as they may vary depending upon the type of circuit technology employed, e.g. CMOS. However, to aid in the description, this embodiment may be assumed to count the number of 1's in the input data word. Therefore, a signal with a suffix of 'L' is active when low, or 0, and a signal with a suffix of 'H' is active when high, or 1.

A plurality of signal paths is formed from the bits of the input data word, comprising a true signal path (e.g., 20) and a complementary signal path (e.g., 10) for each bit of the input data word. A plurality of series paths, controlled by a plurality of transfer gates (e.g., 30, 60, and 76), conducts electricity between a signal source 4 and a one-hot output 118–122. Each transfer gate (e.g., 30) comprises a control input 32 and two terminals, an input or signal input 34, and an output or signal output 36. A transfer gate 30 conducts electricity between its terminals 34 and 36 when its control input 32 is active. Therefore, when 0L is active, the control input 32 of the transfer gate 30 is active and the input 34 is connected to the output 36. The input 4 to the plurality of series paths is tied to ground, while the outputs 40, 42, 44, 46, and 48 of the plurality of series paths are tied to power, or Vdd, through precharger transistors 50–54. Vdd is indicated by a horizontal bar in the FIGs.

It is important to note that for the purposes of this description and the attached claims, the term "transfer gate" is used generically and may refer to a single transistor, a pair of transistors, or any device or circuit which performs the function described above, and it may be implemented in any suitable technology such as CMOS.

Precharger transistors 50–54 are controlled by a clock signal, or CK, which has two phases. In the preferred embodiment, precharger transistors 50–54 comprise P-channel FET's, which close when the control signal is low. In the first, or precharge, phase of CK, when CK is low, the precharger transistors are on. In the second, or evaluate, phase of CK, when CK is high, the precharger transistors are off and the state of the circuit is evaluated. The outputs 40, 42, 44, 46, and 48 are therefore tied to power during the precharge phase of CK and are in a high state unless they are pulled down to the ground at the input 4 through the transfer gates (e.g., 30) during the evaluate phase of CK.

Figure 8:
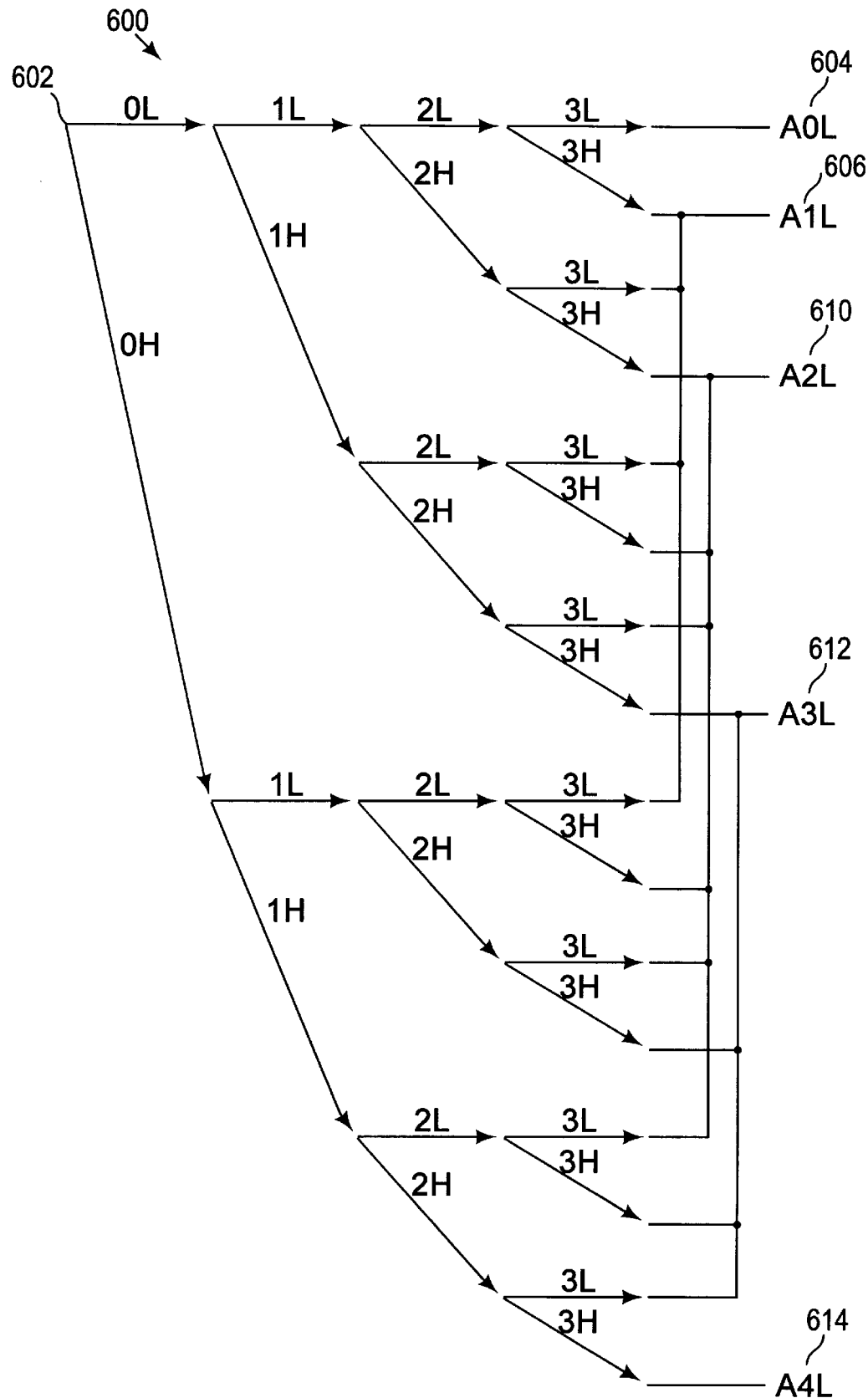
FIG. 8 is a schematic of a tree structured circuit for producing a one-hot encoded count of like signals in a four bit data word.

The plurality of series paths leading to the plurality of one-hot outputs may be arranged in a number of configurations, with varying levels of optimization. In one embodiment, each series path is independent, with no sharing of transfer gates. In another embodiment, the series paths are combined into a tree structure 600 as illustrated in FIG. 8, with sharing of transfer gates near the input 602 of the tree, but with each series path diverging until at the outputs A0L–A4L 604–614 each series path is independent. In a preferred embodiment, shown in FIG. 1, the series paths are arranged in a lattice structure, with sharing of transfer gates near the input 4 of the lattice as in the tree structure above. Series paths then diverge according to differing control inputs, then reconverge to share transfer gates with common control inputs.

Each output 40–48 of the lattice shown in FIG. 1 indicates a different number of like signals in the input data bits. The first output 40 indicates that there are no 1's in the input data bits 0–3. The output 40 is pulled down to ground, indicating that it is the active output, when inputs 0L 10, 1L 12, 2L 14, and 3L 16 are all active, causing their associated transfer gates 30, 60, 62, and 64 to close, or activate and conduct electricity. The path from the ground at the input 4, through the transfer gates 30, 60, 62, and 64, to the output 40, is the only path through the lattice that conducts all the way from input 4 to output 40, thus the output 40 indicating zero 1's is the only active output. In this case, the remaining outputs 42, 44, 46, and 48, are all inactive, or pulled high to Vdd. When inputs 0L 10, 1L 12, 2L 14, and 3L 16 are all active, inputs 0H 20, 1H 22, 2H 24, and 3H 26 are all inactive, and all other paths through the lattice are blocked by at least one open transfer gate.

The second output 42 indicates that there is one 1 in the input data bits 0–3, or that one of the inputs 0H 20, 1H 22, 2H 24, and 3H 26 are 1 and the rest are 0. There are four paths through the lattice leading from the input 4 to the second output 42, as there are four possible combinations in the input data bits 0–3 resulting in one 1. The first of the four paths is active when bits 0–2 are 0 and bit 3 is 1. In this case, inputs 0L 10, 1L 12, 2L 14, and 3H 26 are active, so transfer gates 30, 60, 62 and 70 are closed (active). The second of the four paths is active when bits 0,1, and 3 are 0 and bit 2 is 1. In this case, inputs 0L 10, 1L 12, 2H 24, and 3L 16 are active, so transfer gates 30, 60, 72 and 74 are closed. The third of the four paths is active when bits 0,2, and 3 are 0 and bit 1 is 1. In this case, inputs 0L 10, 1H 22, 2L 14, and 3L 16 are active, so transfer gates 30, 76, 80 and 74 are closed. The fourth of the four paths is active when bits 1,2, and 3 are 0 and bit 0 is 1. In this case, inputs 0H 20, 1L 12, 2L 14, and 3L 16 are active, so transfer gates 84, 86, 80 and 74 are closed. When any of these four paths is active, output 42 indicating one 1 is active (low, tied to ground), and the remaining outputs 40, 44, 46, and 48 are inactive (high, tied to Vdd).

It is important to note that the circuit illustrated in FIG. 1 is optimized to use a minimum number of gates or transistors. One of ordinary skill in the art could rearrange the circuit to a non-optimized state to perform the same function. For example, the five paths leading to outputs 40 and 42 discussed above share transfer gates to minimize the required elements. The same function could be achieved in a less efficient manner without sharing transfer gates. Each path to an output could be made partially or wholly independent of all others. For example, each path could have its own four transfer gates, and the results could be combined to the same five outputs. However, the use of such a non-optimized form of the circuit disclosed in FIG. 1 would not depart from the inventive concepts disclosed herein.

The third output 44 indicates that there are two 1's in the input data bits 0–3, or that two of the inputs 0H 20, 1H 22, 2H 24, and 3H 26 are 1 and the others are 0. There are six paths through the lattice leading from the input 4 to the third output 44, as there are six possible combinations in the input data bits 0–3 resulting in two 1's. When bits 0 and 1 are 1 (0H 20 and 1H 22 are active) the active path through the lattice is through transfer gates 84, 94, 96, and 92. When bits 0 and 2 are 1 (0H 20 and 2H 24 are active) the active path through the lattice is through transfer gates 84, 86, 90, and 92. When bits 0 and 3 are 1 (0H 20 and 3H 26 are active) the active path through the lattice is through transfer gates 84, 86, 80, and 82. When bits 1 and 2 are 1 (1H 22 and 2H 24 are active) the active path through the lattice is through transfer gates 30, 76, 90, and 92. When bits 1 and 3 are 1 (1H 22 and 3H 26 are active) the active path through the lattice is through transfer gates 30, 76, 80, and 82. When bits 2 and 3 are 1 (2H 24 and 3H 26 are active) the active path through the lattice is through transfer gates 30, 60, 72, and 82.

The fourth output 46 indicates that there are three 1's in the input data bits 0–3, or that three of the inputs 0H 20, 1H 22, 2H 24, and 3H 26 are 1 and the remaining input is 0. There are four paths through the lattice leading from the input 4 to the fourth output 46. First, when bits 0, 1, and 2 are 1 (0H 20, 1H 22, and 2H 24 are active) the active path through the lattice is through transfer gates 84, 94, 102, and 104. Second, when bits 0, 1, and 3 are 1 (0H 20, 1H 22, and 3H 26 are active) the active path through the lattice is through transfer gates 84, 94, 96, and 100. Third, when bits 1, 2, and 3 are 1 (1H 22, 2H 24, and 3H 26 are active) the active path through the lattice is through transfer gates 30, 76, 90, and 100. Fourth, when bits 0, 2, and 3 are 1 (0H 20, 2H 24, and 3H 26 are active) the active path through the lattice is through transfer gates 84, 86, 90, and 100.

The fifth and last output 48 indicates that there are four 1's in the input data bits 0–3, or that all three of the inputs 0H 20, 1H 22, 2H 24, and 3H 26 are 1. There is only one path through the lattice leading from the input 4 to the fifth output 48. The active path through the lattice from the input 4 to the fifth output 48 is through transfer gates 84, 94, 102, and 106.

Each transfer gate (e.g., 30) has a voltage drop across it, so the outputs (e.g., 40) will not be pulled all the way down to the ground level at the input 4. To compensate, buffers 112–116 are connected to the outputs to restore the full voltage swing for whatever technology is used (e.g., CMOS). In the preferred embodiment, inverters 112–116 are used. Output 40, which is active when low, is inverted to output 118 A0H which is active when high. The outputs of the first stage 2 with input bits 0–3, A0H 118, A1H 119, A2H 120, A3H 121, and A4H 122, are high when active and low when inactive.

In the preferred embodiment, the inputs 0L–3L 10–16 and 0H–3H 20–26 are inactive during some clock phases. If the precharger gates 40–48 and the inputs 0L–3L 10–16 and 0H–3H 20–26 are simultaneously inactive, the output paths are left floating. In a high speed circuit, this is generally not a problem since the charge on the output paths does not leak quickly enough to cause the logic states to change. However, in the preferred embodiments, this floating condition is avoided by adding hold transistors 55–59 to the circuit. A hold transistor (e.g., 55) is connected to each output path, with the signal input being connected to Vdd and the output signal being connected to the output path prior to the inverter (e.g., 112). The control input of the hold transistor (e.g., 55) is connected to the output of the inverter (e.g., 112). Therefore, the output paths are pulled high (inactive) at all times when the precharger gates 40–48 and the data inputs are inactive, and the output of the inverter is low. The hold transistor 55–59 do make it more difficult to change the state of an output path and its associated inverter (e.g., 112), so the needs of the target application must be considered when deciding whether to include hold transistor 55–59.

The circuit illustrated in FIG. 1 is shown using CMOS transfer gates. However, the circuit may be implemented in any technology now known or which may be developed in the future without departing from the inventive concepts disclosed herein. For example, the circuit could be implemented with CMOS gates, NMOS, NMOS-PMOS pairs, etc. The preferred embodiment is implemented using CMOS transfer gates to minimize the number of transistors required. However, transfer gates have an inherent voltage drop across each gate, so the output may be boosted back to normal operating levels by a buffer as described above.

The circuit may also be implemented as active-high or active-low, as it is the information encoded in the signal which is important, not the state of the signal. The choice of technology or the specific layout of the circuit is dependent upon the requirements of the overall system, and may be adapted as needed by one skilled in the art.

It is important to note that the first stage of the circuit as illustrated in FIG. 1 is not limited to a four-bit data word. The first stage as illustrated in FIG. 1 could be reduced to operate on a data word as small as two bits, or expanded to operate on a data word of any width greater than two bits. The four bit width of the preferred embodiment may optimize loading on each output node, depending upon the technology used.

Figure 2:
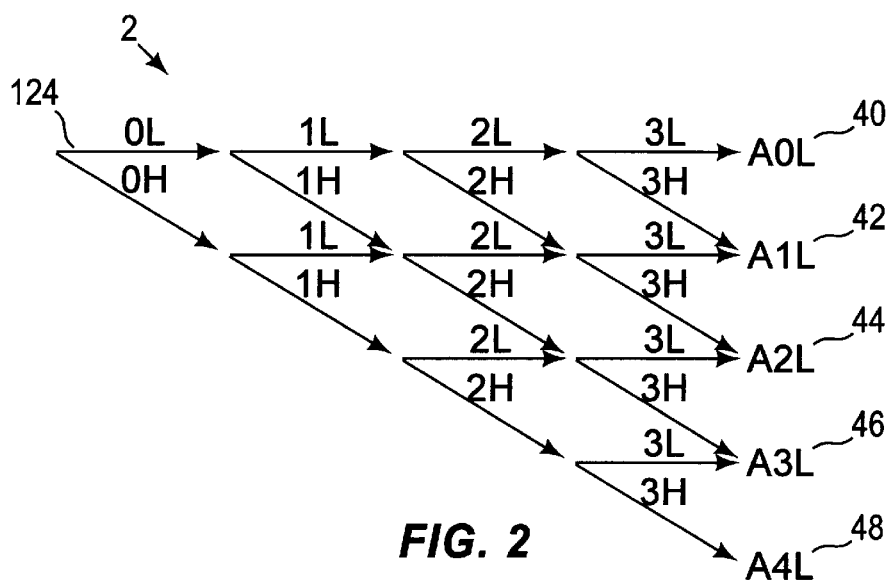
FIG. 2 is a signal flow diagram of the circuit of FIG. 1.

FIG. 2 is a diagram showing the paths of the circuit of FIG. 1 generally, without the inverting buffers 55–59 and 112–116. Each line (e.g., 124) corresponds to a gate of some type, whether it be a CMOS transfer gate, a gate of some other technology, or a device of another configuration. The outputs are the active low outputs A0L 40, A1L 42, A2L 44, A3L 46, and A4L 48. A0L indicates that there are zero 1's in the input bits 0–3, A1L that there are one, A2L two, A3L three, and A4L four 1's in the input bits.

Figure 3:
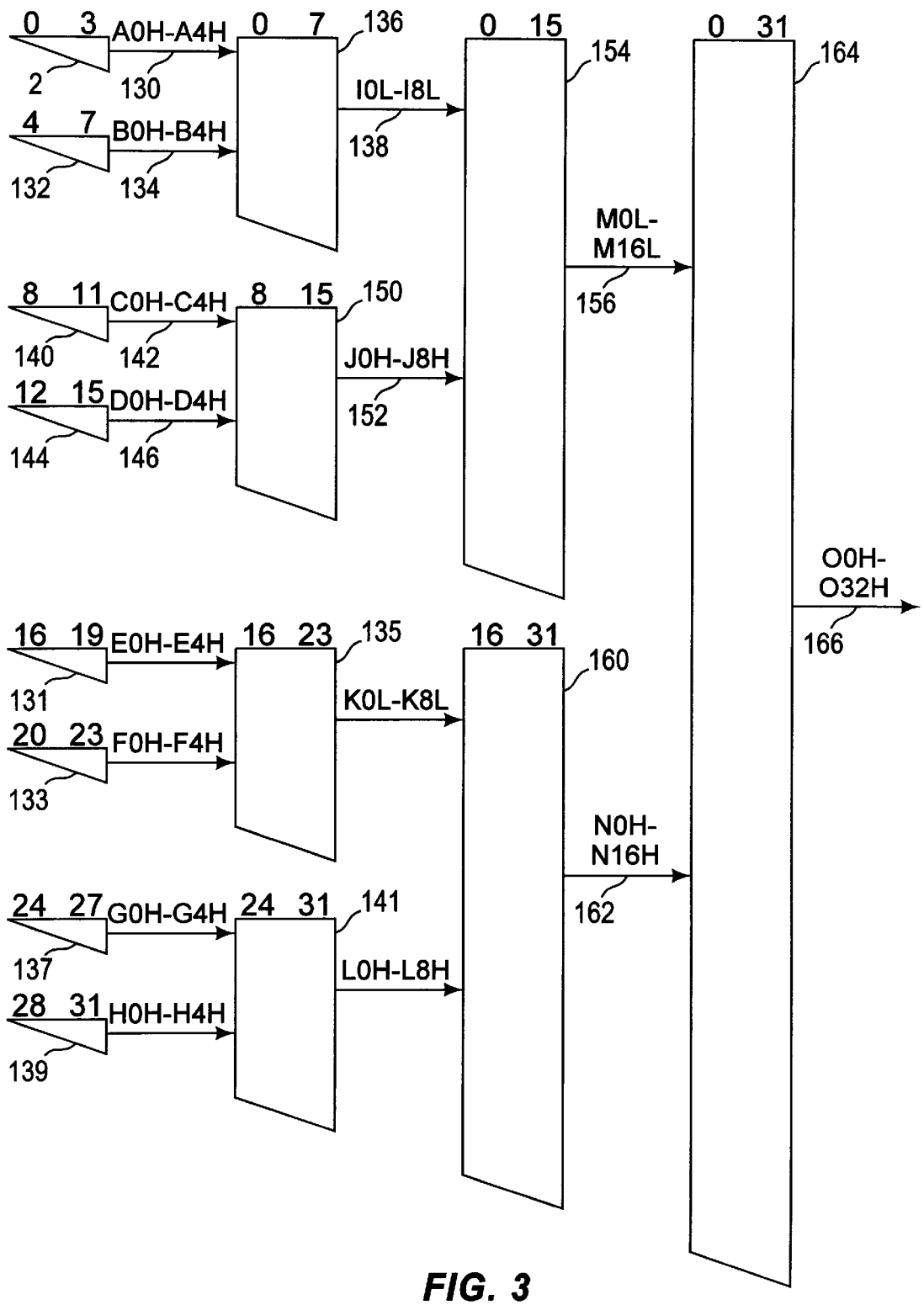
FIG. 3 is a block diagram of a first stage circuit to count like signals in a 64 bit data word.

As mentioned above, in the preferred embodiment the input data word of 64 bits is broken into smaller four bit data words. The number of like signals, in this case 1's, in each four bit data word is counted by the circuit of FIG. 1 described above. The resulting counts for each four bit data word are then combined in subsequent stages of the counting circuit until a result is reached for the entire 64 bit input data word. FIG. 3 is a block diagram illustrating this process for a 32 bit data word, which is extensible to larger input data words. A first lattice 2 having input bits 0–3 of the 32 bit data word produces a one-hot encoded output A0H–A4H 130. A second lattice 132 having input bits 4–7 produces a one-hot encoded output B0H–B4H 134. The two outputs A0H–A4H 130 and B0H–B4H 134 are combined in a second stage 136, which produces a 9 bit one-hot encoded output I0L–I8L 138.

The 9 bit count J0H–J8H 152 of 1's for the second 8 bits of the input data word, bits 8–15, is produced similarly. A lattice 140 produces an output C0H–C4H 142 based on input bits 8–11, and a lattice 144 produces an output D0H–D4H 146 based on input bits 12–15. These two outputs 142 and 146 are combined in a second stage 150 which produces the 9 bit count J0H–J8H 152.

The two 9 bit outputs I0L–I8L 138 and J0H–J8H 152 are combined in a third stage 154, which produces a 17 bit output M0L–M16L 156. The output M0L–M16L 156 is a one-hot encoded count of the 1's in input bits 0–15. As will be described in more detail later, the number of transfer gates required by third stage 154 is minimized in a preferred embodiment by producing one set of inputs, I0L–I8L 128, as active low, and the other set of inputs, J0H–J8H 152, as active high. This technique may be used in other stages of the circuit as desired, based upon the technology used. Minimizing the critical timing path through the entire circuit, or minimizing the number of gates used, will require different techniques depending upon the technology, and may be adapted by those skilled in the art without departing from the inventive concepts herein.

In another embodiment, gate count is minimized by tying the input high and precharging the outputs low. For example, in FIG. 5, the input 270 may be tied to Vdd rather than to ground, and the precharging gates 287, 289, 291, 293, 295, 297, 299, 301, and 303 may be tied to ground, so that an inactive path is at ground level and an active path is pulled up towards Vdd. However, some target technologies and speed requirements for signal swing time limit the applicability of this embodiment.

A second 17 bit output N0H–N16H 162 is produced in another third stage element 160, based on bits 16–31 of the 32 bit input data word. The output N0H–N16H 162 is produced in a series of first and second stage elements, as described above with respect to output M0L–M16L 156. Bits 16–19 are counted in a first stage element 131 producing active high outputs E0H–E4H. Bits 20–23 are counted in a first stage element 133 producing active high outputs F0H–F4H. First stage outputs E0H–E4H and F0H–F4H are combined in a second stage element 135, producing active low outputs K0L–K8L. Bits 24–27 are counted in a first stage element 137 producing active high outputs G0H–G4H. Bits 28–31 are counted in a first stage element 139 producing active high outputs H0H–H4H. First stage outputs G0H–G4H and H0H–H4H are combined in a second stage element 141, producing active high outputs L0H–L8H. Second stage outputs K0L–K8L and L0H–L8H are combined in a third stage element 160 producing active high outputs N0H–N16H, which is a count of the number of 1's in bits 16–31 of the 32 bit input data word.

The two 17 bit outputs M0L–M16L 156 and N0H–N16H 162 are combined in a fourth stage 164, producing a 33 bit one-hot encoded output O0H–O32H 166. As mentioned above, third stage output M0L–M16L 156 is active low, while output N0H–N16H 162 is active high to minimize the required number of gates in the fourth stage 164.

Figure 4:
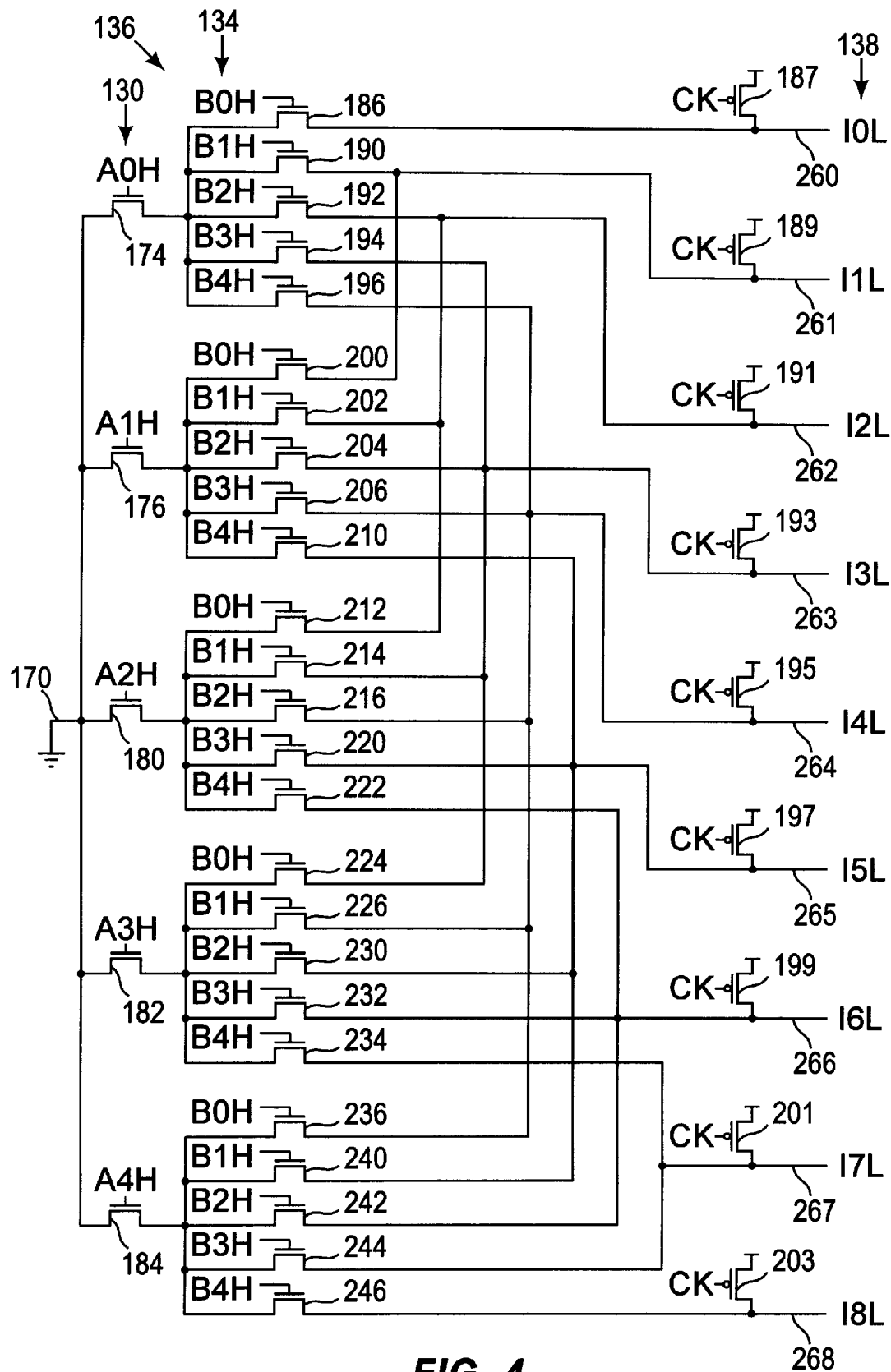
FIG. 4 is a schematic of a second stage circuit to combine the outputs of first stage circuits shown in FIG. 3.

FIG. 4 is a schematic of the circuit of the second stage element 136 shown in FIG. 3. The second stage circuit 136 combines the 5 bit one-hot encoded outputs A0H–A4H 130 and B0H–B4H 134 of first stage counting circuits 2 and 132. The first set of control inputs to the second stage circuit 136, A0H–A4H 130, is a one-hot encoded count of the number of 1's in bits 0–3 of the 32 bit input data word. The second set of control inputs to the circuit 136, B0H–B4H 134, is a one-hot encoded count of the number of 1's in bits 4–7 of the 32 bit input data word. A 9 bit one-hot encoded output I0L–I8L 138 is produced by this circuit 136, as a count of the number of 1's in bits 0–7 of the 32 bit input data word.

A signal input 170 to the second stage circuit 136 is tied to ground, while the outputs I0L–I8L 138 are pulled high to Vdd through precharger gates 187, 189, 191, 193, 195, 197, 199, 201, and 203. Each of the first set of control inputs, A0H–A4H 130, act as the control input of one transfer gate (e.g., 174). Each of the second set of control inputs, B0H–B4H 134, acts as the control input of five transfer gates (e.g., 186), one for each of the five first control inputs A0H–A4H 130.

A first output I0L 260 indicates that there are zero 1's in the input data bits 0–7. There is only one path through the second stage circuit 136 leading to the first output I0L 260. In other words, there is only one combination of input signals A0H–A4H 130 and B0H–B4H 134 which indicates that there are no 1's in the input data bits 0–7. When A0H and B0H are active, indicating that there are no 1's in first stages 2 and 132, transfer gates 174 and 186 are closed, pulling the output I0L 260 down to the ground at the input 170. In this case, the remaining outputs I1L–I8L (261–268) are inactive, or pulled high to Vdd through precharger gates 187, 189, 191, 193, 195, 197, 199, 201, and 203.

A second output I1L 261 indicates that there is one 1 in the input data bits 0–7. There are two paths through the second stage circuit 136 which activate this output, either when only A1H is active or only B1H is active. The first path is through transfer gates 174 and 190, the second is through transfer gates 176 and 200.

A third output I2L 262 indicates that there are two 1's in the input data bits 0–7. There are three paths to this output. The first, when A0H and B2H are active, is through transfer gates 174 and 192. The second, when A1H and B1H are active, is through transfer gates 176 and 202. The third, when A2H and B0H are active, is through transfer gates 180 and 212.

A fourth output I3L 263 indicates that there are three 1's in the input data bits 0–7. There are four paths to this output. The first, when A0H and B3H are active, is through transfer gates 174 and 194. The second, when A1H and B2H are active, is through transfer gates 176 and 204. The third, when A2H and B1H are active, is through transfer gates 180 and 214. The fourth, when A3H and B0H are active, is through transfer gates 182 and 224.

A fifth output I4L 264 indicates that there are four 1's in the input data bits 0–7. There are five paths to this output. The first, when A0H and B4H are active, is through transfer gates 174 and 196. The second, when A1H and B3H are active, is through transfer gates 176 and 206. The third, when A2H and B2H are active, is through transfer gates 180 and 216. The fourth, when A3H and B1H are active, is through transfer gates 182 and 226. The fifth, when A4H and B0H are active, is through transfer gates 184 and 236.

A sixth output I5L 265 indicates that there are five 1's in the input data bits 0–7. There are four paths to this output. The first, when A1H and B4H are active, is through transfer gates 176 and 210. The second, when A2H and B3H are active, is through transfer gates 180 and 220. The third, when A3H and B2H are active, is through transfer gates 182 and 230. The fourth, when A4H and B1H are active, is through transfer gates 184 and 240.

A seventh output I6L 266 indicates that there are six 1's in the input data bits 0–7. There are three paths to this output. The first, when A2H and B4H are active, is through transfer gates 180 and 222. The second, when A3H and B3H are active, is through transfer gates 182 and 232. The third, when A4H and B2H are active, is through transfer gates 184 and 242.

An eighth output I7L 267 indicates that there are seven 1's in the input data bits 0–7. There are two paths to this output. The first, when A3H and B4H are active, is through transfer gates 182 and 234. The second, when A4H and B3H are active, is through transfer gates 184 and 244.

The ninth and final output I8L 268 indicates that all 8 of the input data bits 0–7 are one, thus there is only one path to this output. When A4H and B4H are both active, transfer gates 184 and 246 are closed.

Figure 5:
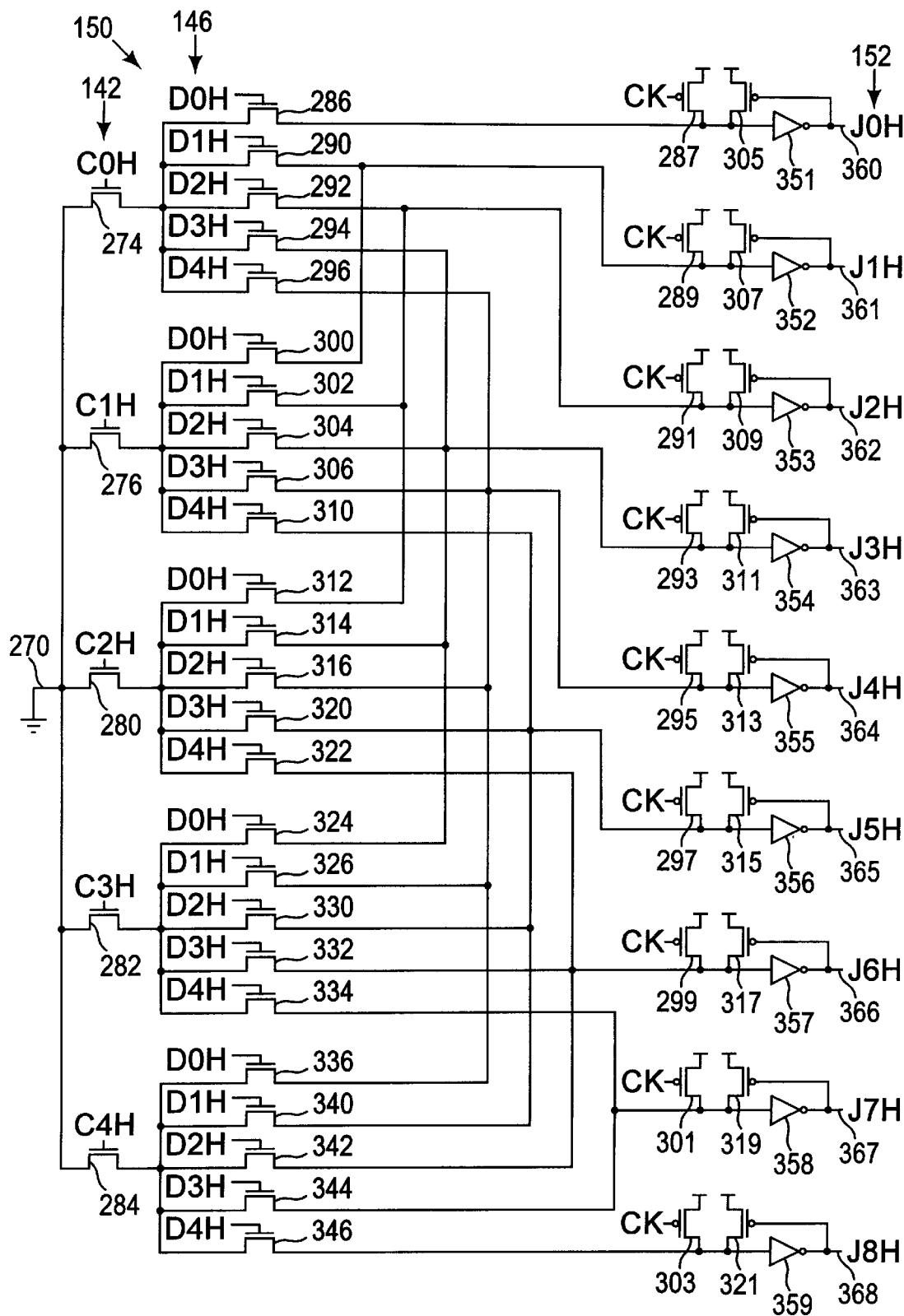
FIG. 5 is a schematic of a second stage circuit having complemented and buffered outputs.

FIG. 5 is a schematic of the circuit of the second stage element 150 shown in FIG. 3. The second stage circuit 150 combines the 5 bit one-hot encoded outputs C0H–C4H 142 and D0H–D4H 146 of first stage counting circuits 140 and 144. This second stage circuit 150 is substantially the same as the second stage circuit 136 described above, except that the outputs J0H–J8H 152 are inverted. As will be described in more detail later, this allows the required number of gates in the third stage of the counting circuit to be minimized.

The first set of control inputs to the second stage circuit 150, C0H–C4H 142, is a one-hot encoded count of the number of 1's in bits 8–11 of the 32 bit input data word. The second set of control inputs to the circuit 150, D0H–D4H 146, is a one-hot encoded count of the number of 1's in bits 12–15 of the 32 bit input data word. A 9 bit one-hot encoded output J0H–J8H 152 is produced by this circuit 150, as a count of the number of 1's in bits 8–15 of the 32 bit input data word.

A signal source 270 to the second stage circuit 150 is tied to ground, while the outputs J0H–J8H 152 are pulled high to Vdd through precharger gates 287, 289, 291, 293, 295, 297, 299, 301, and 303, then buffered by invertors 351–359. The state of the outputs J0H–J8H 152 are also prevented from floating due to inactive inputs and precharger gates 40–48 with hold transistors 305, 307, 309, 311, 313, 315, 317, 319, and 321, as described above.

Each of the first set of control inputs, C0H–C4H 142, act as the control input of one transfer gate (e.g., 274). Each of the second set of control inputs, D0H–D4H 146, acts as the control input of five transfer gates (e.g., 286), one for each of the five first control inputs C0H–C4H 142.

A first output J0H 360 indicates that there are zero 1's in the input data bits 8–15. There is only one path through the second stage circuit 150 leading to the first output J0H 360. In other words, there is only one combination of input signals C0H–C4H 142 and D0H–D4H 146 which indicates that there are no 1's in the input data bits 8–15. When C0H and D0H are active, indicating that there are no 1's in first stages 140 and 144, transfer gates 274 and 286 are closed, pulling the output J0H 360 down to the ground at the input 270. In this case, the remaining outputs J1H–J8H (361–368) are inactive, or pulled high to Vdd through precharger gates 287, 289, 291, 293, 295, 297, 299, 301, and 303.

A second output J1H 361 indicates that there is one 1 in the input data bits 8–15. There are two paths through the second stage circuit 150 which activate this output, either when only C1H is active or only D1H is active. The first path is through transfer gates 274 and 290, the second is through transfer gates 276 and 300.

A third output J2H 362 indicates that there are two 1's in the input data bits 8–15. There are three paths to this output. The first, when C0H and D2H are active, is through transfer gates 274 and 292. The second, when C1H and D1H are active, is through transfer gates 276 and 302. The third, when C2H and D0H are active, is through transfer gates 280 and 312.

A fourth output J3H 363 indicates that there are three 1's in the input data bits 8–15. There are four paths to this output. The first, when C0H and D3H are active, is through transfer gates 274 and 294. The second, when C1H and D2H are active, is through transfer gates 276 and 304. The third, when C2H and D1H are active, is through transfer gates 280 and 314. The fourth, when C3H and D0H are active, is through transfer gates 282 and 324.

A fifth output J4H 364 indicates that there are four 1's in the input data bits 8–15. There are five paths to this output. The first, when C0H and D4H are active, is through transfer gates 274 and 296. The second, when C1H and D3H are active, is through transfer gates 276 and 306. The third, when C2H and D2H are active, is through transfer gates 280 and 316. The fourth, when C3H and D1H are active, is through transfer gates 282 and 326. The fifth, when C4H and D0H are active, is through transfer gates 284 and 336.

A sixth output J5H 365 indicates that there are five 1's in the input data bits 8–15. There are four paths to this output. The first, when C1H and D4H are active, is through transfer gates 276 and 310. The second, when C2H and D3H are active, is through transfer gates 280 and 320. The third, when C3H and D2H are active, is through transfer gates 282 and 330. The fourth, when C4H and D1H are active, is through transfer gates 284 and 340.

A seventh output J6H 366 indicates that there are six 1's in the input data bits 8–15. There are three paths to this output. The first, when C2H and D4H are active, is through transfer gates 280 and 322. The second, when C3H and D3H are active, is through transfer gates 282 and 332. The third, when C4H and D2H are active, is through transfer gates 284 and 342.

An eighth output J7H 367 indicates that there are seven 1's in the input data bits 8–15. There are two paths to this output. The first, when C3H and D4H are active, is through transfer gates 282 and 334. The second, when C4H and D3H are active, is through transfer gates 284 and 344.

The ninth and final output J8H 368 indicates that all 8 of the input data bits 8–15 are one, thus there is only one path to this output. When C4H and D4H are both active, transfer gates 284 and 346 are closed.

The outputs of the paths through the transfer gates (e.g., 274 and 286) are active low, as they are pulled down to the ground at the input 270 when they are active. To minimize the number of gates in the next stage, the outputs J0H–8H are buffered and inverted by buffers 305, 307, 309, 311, 313, 315, 317, 319, 321, and 351–359, so that they are active high.

The two sets of outputs of the second stage circuits 136 and 150 are combined in a third stage circuit 154. The first output, I0L–I8L 138, is a one-hot encoded count of the number of 1's in bits 0–7 of the 32 bit input data word. The second output, J0H–J8H 152, is a one-hot encoded count of the number of 1's in bits 8–15 of the 32 bit input data word. The combined count, M0L–M16L 156, is the output of the third stage circuit 154.

FIGS. 6A–6J are a series of schematics showing the circuit paths through the third stage circuit 154 leading to a number of the signals in the output M0L–M16L 156.

Figure 6A:
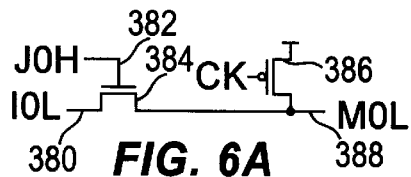
FIGS. 6A–6J are schematics of a third stage circuit to combine the outputs of the second stage circuits shown in FIGS. 4 and 5.

FIG. 6A illustrates the circuit path to produce the M0L output 388. Similar to the zero 1 paths described above with respect to previous stages of the counting circuit, there is only one path leading to the M0L output 386. When the zero 1 signals I0L 260 and J0H 360 in the previous stages are both active, indicating zero 1's in bits 0–7 and 8–15, respectively, of the 32 bit input data word, the M0L output 388 is also active, indicating zero 1's in bits 0–15 of the 32 bit input data word.

Note that although I0L and J0H are active at different voltage levels, as stated above it is not the type of signal that is important, but the information encoded in the signal. The signal type (e.g., active high) may be adapted as needed to use the counting circuit in the target technology, and to either minimize the critical timing path or the number of gates. In the preferred embodiment described herein, I0L is active and indicates no 1's when it is low, while J0H is active and indicates no 1's when it is high.

The first input I0L 260 is connected to the signal input 380 of the transfer gate 384. The second input J0H 382 is connected to the control input of the transfer gate 384. The output M0L 388 is pulled high to Vdd through a precharger gate 386. Therefore, output M0L 388 is active (pulled low) only when I0L 260 is active (low) and J0H 360 is active (high), causing the transfer gate 384 to close and conduct electricity to connect the input 380 with the output 388. If J0H 360 is inactive (low), indicating that there is at least one 1 in input bits 8–15, the transfer gate 384 will not close and the output M0L 388 is inactive (high). If I0L 260 is inactive (high), indicating that there is at least one 1 in input bits 0–7, the output M0L 388 is inactive. In this case, output M0L 388 is inactive regardless of the state of J0H 360, since the output M0L 388 will be pulled high either through the precharger gate 386 or by input I0L 260, or both.

This technique allows the combination of two signals in one transfer gate (e.g., 384) by using one as the signal input and one as the control input. In contrast, in the second stage circuits 136 and 150 described earlier, each path through the circuit must flow through two transfer gates (e.g., 174 and 186), and the signal input to the path (e.g., 170) is tied to ground. This minimizing technique may be used in any stage as desired and as applicable to the target technology (e.g., CMOS).

For example, this minimizing technique could be used to combine the outputs of two first-stage elements, using one transfer gate for each two input signals. In this case, A0L–A4L 40–48 is combined with B0H–B4H 134 as described above and as exemplified in FIG. 6. The first set of outputs, A0L–A4L 40–48, is connected to the first terminals (inputs) of a set of transfer gates. The second set of outputs, B0H–B4H 134, is connected to the control inputs of the set of transfer gates. The second terminals (outputs) of the set of transfer gates are connected together and precharged high to form the output of the second stage.

Alternatively, all stages may be implemented as described in the second stage circuit 136 with two transfer gates per path. In another embodiment (not shown), as mentioned above, the lattice of the counting circuit of stage one (e.g., 2) may be expanded to count any number of input bits with no secondary stages to combine counts from multiple first stages.

Figure 6B:
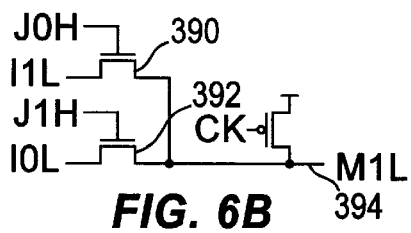

FIG. 6B illustrates the path through the third stage 154 leading to the second output M1L 394. The output M1L 394 indicates, when active, that there is one 1 in bits 0–15 of the 32 bit input data word. There are two paths to this output, when I1L and J0H are active, through transfer gate 390, and when I0L and J1H are active, through transfer gate 392.

Figure 6C:
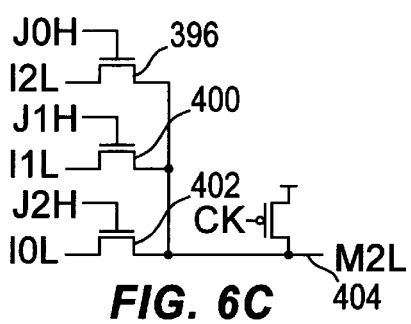
Figure 6D:
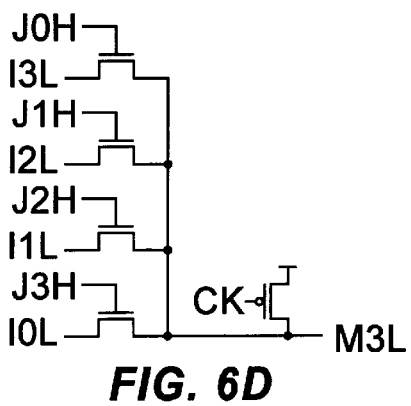
Figure 6E:
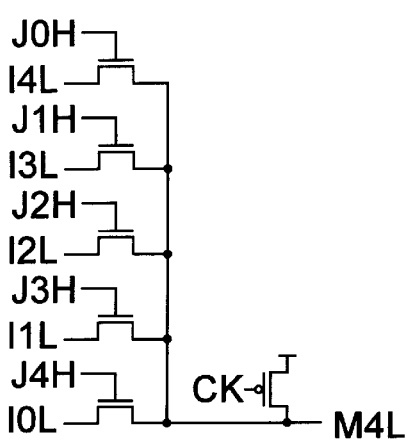
Figure 6F:
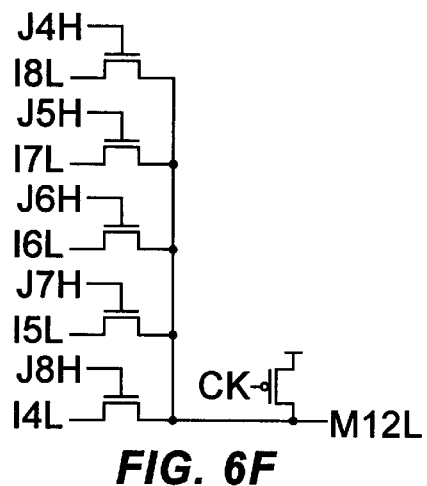
Figure 6G:
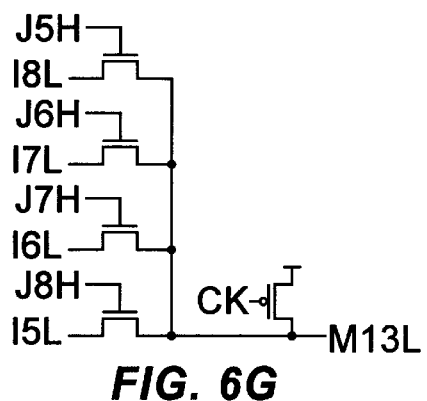
Figure 6H:
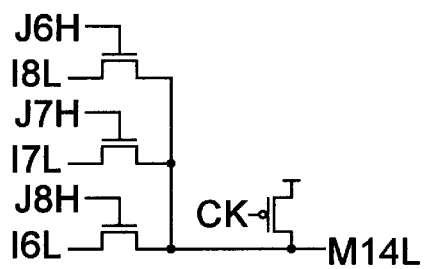
Figure 6I:
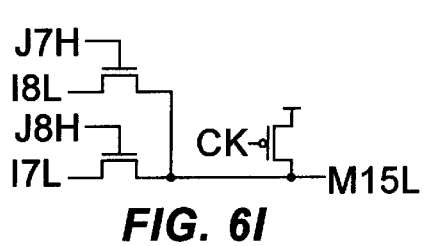
Figure 6J:
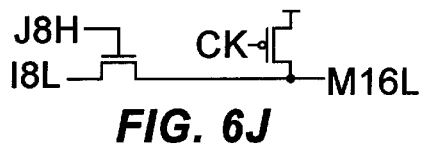

FIG. 6C illustrates the circuit for the output M2L 404 which indicates two 1's in the input bits 0–15. There are three paths to this output. The first, when I2L and J0H are active, is through transfer gate 396. The second, when I1L and J1H are active, is through transfer gate 400. The third, when I0L and J2H are active, is through transfer gate 402.

FIGS. 6D–6J illustrate the circuits for outputs M3L, M4L, and M12L–M16L, which are constructed in a pattern similar to that used for outputs M0L 388, M1L 394, and M2L 404. Each output is active when any of the possible combinations on the inputs add to the appropriate count for that output.

The count of 1's in bits 16–31 of the 32 bit input data word is similarly counted in first and second stages and combined in a third stage 160 with outputs N0H–N16H 162. As described above, outputs M0L–M16L 156 based on bits 0–15 are active low, while outputs N0H–N16H 162 based on bits 16–31 are active high. This allows them to be combined in a fourth stage 164 to outputs O0H–O32H 166 with a minimum number of gates, as described above with respect to third stage circuit 154.

The counting circuit shown in the block diagram of FIG. 3 may be expanded as needed by adding subsequent stages, so that like signals in a data word of 64, 128 or more bits may be counted. For example, with a 64 bit data word input, a 65 bit one-hot encoded output P0H–P64H (not shown) would be produced.

In another embodiment, the number of zeroes in the input data word may be counted simply by replacing each input bit used in the circuit described above by its complement. For example, 0L 10 and 0H 20 shown in FIG. 1 are swapped. Depending upon the target technology and the width of the input data word, it can require fewer transfer gates to count zeroes rather than ones.

The number of bits used as the inputs to each stage described above is not limited to four for the first stage and 2 for the subsequent stages. Each stage may be widened or narrowed by one skilled in the art without departing from the inventive concepts disclosed herein.

The result of the circuit to count like signals in a data word may be left in one-hot encoded format or transformed as desired. For example, a one-hot to binary encoder will be described hereafter. Alternatively, if the preferred format is one-hot encoding, it may be used as-is.

It may be desirable to produce a one-hot output with the same number of bits as the input data word. For example, in a microprocessor with a 64-bit data bus, the input data word is 64 bits, and the one-hot output is most easily processed if it is also 64 bits. To do this, one bit of the standard 65 bit one-hot count is dropped, leaving 64 bits, and the number represented by the dropped bit is indicated by the remaining 64 bits all having the same value.

In one embodiment, the 65 bit one-hot output P0H–P64H is transformed to a 64 bit $2^{N-1}$ encoded output. The first signal, P0H, which indicates zero 1's in this example, is dropped. The remaining signals, P1H–P64H, indicating a count of 1 to 64 1's, respectively, form the $2^{N-1}$ encoded 64 bit one-hot output. The first, or $2^0$ bitline, indicates one 1. The second, or $2^1$ bitline, indicates two 1's, and so on up to the 64'th, or $2^{63}$ bitline, which indicates 64 1's in the input data word. A count of zero 1's in the input data word is represented by all 64 output bits having the same value, or being low in this example.

In another embodiment, the 65 bit one-hot output P0H–P64H is transformed to a 64 bit $2^N$ encoded output. The last signal, P64H, which indicates 64 1's in this example, is dropped. The remaining signals, P0H–P63H, indicating a count of 0 to 63 1's, respectively, form the $2^N$ encoded 64 bit one-hot output. The first, or $2^0$ bitline, indicates zero 1's. The second, or $2^1$ bitline, indicates a single 1, and so on up to the 64'th, or $2^{63}$ bitline, which indicates 63 1's in the input data word. A count of 64 1's in the input data word is represented by all 64 output bits having the same value, or being low in this example.

FIGS. 7A–7G illustrate an encoder to produce a binary output from a 65 bit one-hot encoded input representing a count of like signals in a 64 bit input data word. The binary encoded output for a 64 bit data word is seven bits wide, since it takes seven bits to represent the number 64 in binary form, and there can be up to 64 like signals in a 64 bit data word. The first one-hot encoded input, indicating zero like signals, is not used, since the default value of the binary output when no inputs are active is zero.

Figure 7A:
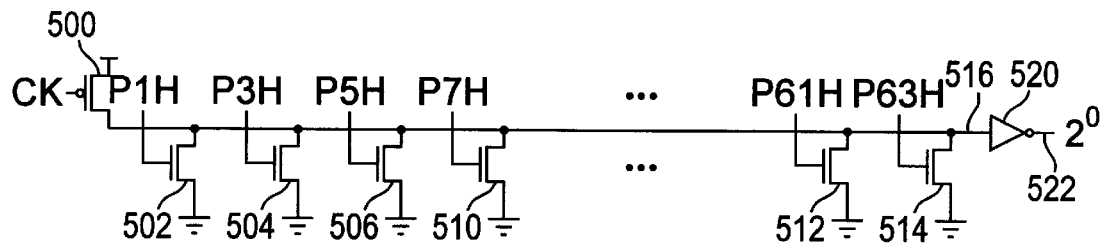
FIGS. 7A–7G are schematics of an encoder to translate the 65 bit one-hot output of the circuit of FIG. 3 to a 7 bit binary output.

FIG. 7A shows the circuit to produce the first output 522, representing the $2^0$ position in the binary encoded output. An active low output 516 is tied high to Vdd through a pre-charger gate 500. A series of gates (e.g., 502–514) are also connected to the active low output 516 to pull it down to ground whenever an appropriate one-hot encoded input is active. The output 516 is active whenever there is an odd number of like signals in the input data word. Therefore, each odd signal in the one-hot encoded output is connected to the control input of a gate (e.g., 502) on the output 516. The first gate 502 is active, pulling the output 516 down to ground, when the one-hot input indicating one like signal (P1H) is active. The second gate 504 is active for three like signals (P3H), gate 506 for five, gate 510 for seven, and so on up to gate 512 which is active for 61 and gate 514 for 63 like signals. In the preferred embodiment illustrated in FIGS. 7A–7G, the one-hot encoded inputs are active high, causing a gate to close and conduct when the control input is high. The resulting active low outputs are inverted to produce an active high signal required by many computers. As shown in FIG. 7A, the active low output 516 is inverted by an inverter 520 to an active high output 522.

Figure 7B:
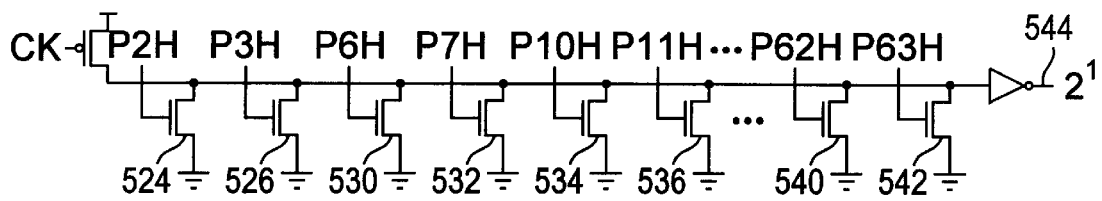

Similarly, FIG. 7B shows the circuit to produce the second output 544, representing the $2^1$ position in the binary encoded output. Output 544 is active when a one-hot encoded signal indicates a count in the series 2, 3, 6, 7, 10, 11, and so on up to 62 and 63. When one-hot encoded signal P2H is active, transfer gate 524 closes to activate the $2^1$ output 544 by pulling it down to ground. When signal P3H is active, transfer gate 526 closes to activate the output 544.

Similarly, a one-hot encoded signal in the series 2, 3, 6, 7, 10, 11, and so on up to 62 and 63 activates a transfer gate 524–542. Note that in order to more clearly indicate the series of one-hot encoded inputs, FIGS. 7A–7F do not show all the transfer gates needed. Rather, FIGS. 7A–7F indicate the series of inputs, and each input in the series is connected to the control input of a transfer gate.

Figure 7C:
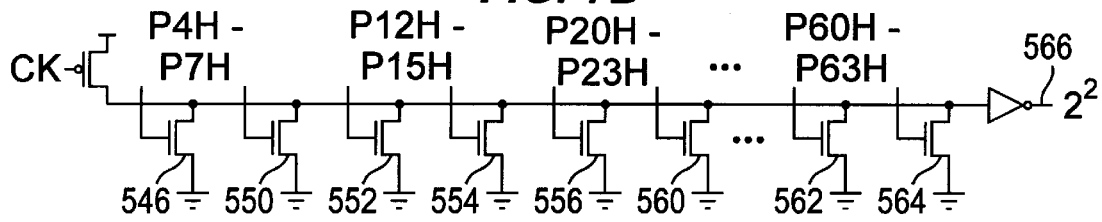

The third output 566 representing the $2^2$ position, shown in FIG. 7C, is active when a one-hot input in the series 4–7, 12–15, 20–23, and so on up to 60–63 is active. As explained above, not every transfer gate needed is displayed. For example, inputs P4H–P7H are each connected to the control input of a transfer gate, requiring four transfer gates. However, only two transfer gates are displayed 546 and 550, indicating the start and end transfer gates in the range. Likewise, the other displayed transfer gates 552–564 indicate start and end transfer gates in selected ranges of the overall series for the connected output 566.

Figure 7D:
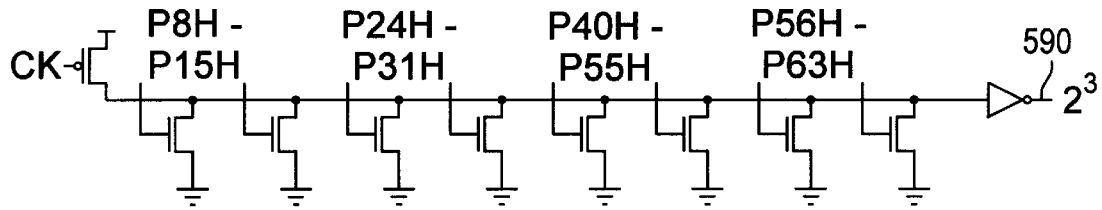

The fourth output 590 representing the $2^3$ position, shown in FIG. 7D, is active when a one-hot input in the series 8–15, 24–31, 40–55, and 56–63 is active.

Figure 7E:
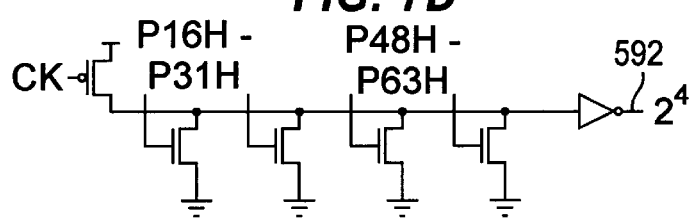

The fifth output 592 representing the $2^4$ position, shown in FIG. 7E, is based on one-hot encoded inputs in the series 16–31 and 48–63.

Figure 7F:
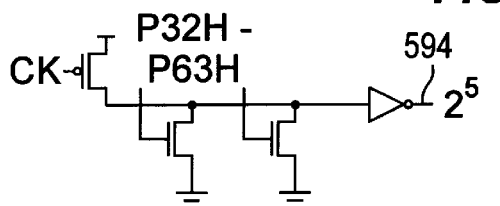

The sixth output 594 representing the $2^5$ position, shown in FIG. 7F, is based on one-hot encoded inputs in the range 32–63.

Figure 7G:
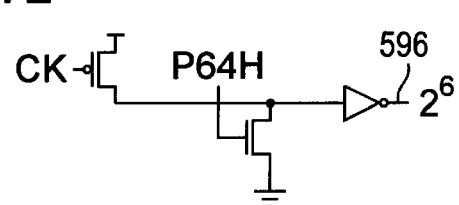

Finally, the seventh output 596 representing the $2^6$ position, shown in FIG. 7G, is based on the one-hot encoded input indicating 64 like signals.

The embodiment of the encoder illustrated in FIGS. 7A–7G may be adapted as needed for the target technology without departing from the inventive concepts disclosed herein. For example, buffers may be needed in some technologies or at some operating voltage levels to avoid loading down the output signals.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method of manufacturing a device for counting a number of like signals in a plurality of data bits, comprising:

a) providing a first plurality of signal paths comprising a true signal path and a complementary signal path for each of N data bits;

b) providing a first plurality of transfer gates, each of the first plurality of transfer gates comprising two terminals and a control input, whereby application of a signal to the control input of a given one of the first plurality of transfer gates enables opening and closing of a connection between the two terminals of the given one of the first plurality of transfer gates;

c) interconnecting a first signal source to a first plurality of one-hot outputs via the first plurality of transfer gates by forming a first plurality of series paths between the first signal source and the first plurality of one-hot outputs, each of the first plurality of series paths comprising a subset of the first plurality of transfer gates which are connected via their terminals; and d) connecting ones of the first plurality of signal paths to ones of the control inputs of the first plurality of transfer gates by:

i) connecting a different one of the first plurality of signal paths to the control input of each transfer gate forming a given one of the first plurality of series paths;

ii) connecting a different subset of the first plurality of signal paths to the control inputs of transfer gates in each series path of the first plurality of series paths; and iii) connecting a same ratio of true signal paths for the N data bits to complementary signal paths for the N data bits to the control inputs of transfer gates in each series path of the first plurality of series paths which interconnects the first signal source to a given one of the first plurality of one-hot outputs.

2. A method as in claim 1, further comprising interconnecting the first signal source to the first plurality of one-hot outputs via the first plurality of transfer gates by forming a lattice of transfer gates between the first signal source and the first plurality of one-hot outputs.

3. A method as in claim 1, further comprising interconnecting the first signal source to the first plurality of one-hot outputs via the first plurality of transfer gates by forming a tree of transfer gates between the first signal source and the first plurality of one-hot outputs.

4. A method as in claim 1, further comprising:

a) providing at least one second plurality of one-hot outputs which is indicative of a number of like signals in M data bits;

b) providing a second plurality of transfer gates, each of the second plurality of transfer gates comprising two terminals and a control input, whereby application of a signal to the control input of a given one of the second plurality of transfer gates enables opening and closing of a connection between the two terminals of the given one of the second plurality of transfer gates;

c) interconnecting the first signal source to a third plurality of one-hot outputs via the second plurality of transfer gates by forming a second plurality of series paths between the first signal source and the third plurality of one-hot outputs, each of the second plurality of series paths comprising a subset of the second plurality of transfer gates which are connected via their terminals; and d) connecting ones of the first and at least one second plurality of one-hot outputs to ones of the control inputs of the second plurality of transfer gates by:

i) connecting one of the first plurality of one-hot outputs and one of each of the at least one second pluralities of one-hot outputs to the control inputs of the transfer gates forming a given one of the second plurality of series paths; and ii) connecting a different subset of the first and at least one second plurality of one-hot outputs to the control inputs of transfer gates in each series path of the second plurality of series paths.

5. A method as in claim 4, further comprising:

a) providing at least one fourth plurality of one-hot outputs which is indicative of a number of like signals in L data bits;

b) providing a third plurality of transfer gates, each of the third plurality of transfer gates comprising two terminals and a control input, whereby application of a signal to the control input of a given one of the third plurality of transfer gates enables opening and closing of a connection between the two terminals of the given one of the third plurality of transfer gates;

c) interconnecting the third plurality of one-hot outputs to a fifth plurality of one-hot outputs via the third plurality of transfer gates by forming a third plurality of series paths between the third and fifth pluralities of one-hot outputs, each of the third plurality of series paths comprising a subset of the third plurality of transfer gates which are connected via their terminals; and d) connecting ones of the at least one fourth plurality of one-hot outputs to ones of the control inputs of the third plurality of transfer gates by:

i) connecting one of each of the at least one fourth plurality of one-hot outputs to the control inputs of the transfer gates forming a given one of the third plurality of series paths; and ii) connecting a different subset of the at least one fourth plurality of one-hot outputs to the control inputs of transfer gates in each series path of the third plurality of series paths.

6. A method as in claim 5, wherein providing at least one fourth plurality of one-hot outputs which is indicative of a number of like signals in L data bits comprises:

a) providing a sixth plurality of one-hot outputs which is indicative of a number of like signals in K data bits;

b) providing at least one seventh plurality of one-hot outputs which is indicative of a number of like signals in J data bits;

c) providing a fourth plurality of transfer gates, each of the fourth plurality of transfer gates comprising two terminals and a control input, whereby application of a signal to the control input of a given one of the fourth plurality of transfer gates enables opening and closing of a connection between the two terminals of the given one of the fourth plurality of transfer gates;

c) interconnecting the first signal source to a given one of the at least one fourth plurality of one-hot outputs via the second plurality of transfer gates by forming a fourth plurality of series paths between the first signal source and the given one of the at least one fourth plurality of one-hot outputs, each of the fourth plurality of series paths comprising a subset of the fourth plurality of transfer gates which are connected via their terminals; and d) connecting ones of the sixth and at least one seventh plurality of one-hot outputs to ones of the control inputs of the fourth plurality of transfer gates by:

i) connecting one of the sixth plurality of one-hot outputs and one of each of the at least one seventh pluralities of one-hot outputs to the control inputs of the transfer gates forming a given one of the fourth plurality of series paths; and ii) connecting a different subset of the sixth and at least one seventh plurality of one-hot outputs to the control inputs of transfer gates in each series path of the fourth plurality of series paths.

7. A method as in claim 5, wherein providing at least one fourth plurality of one-hot outputs which is indicative of a number of like signals in L data bits comprises:

a) providing a sixth plurality of one-hot outputs which is indicative of a number of like signals in K data bits;

b) providing at least one seventh plurality of one-hot outputs which is indicative of a number of like signals in J data bits;

c) providing a fourth plurality of transfer gates, each of the fourth plurality of transfer gates comprising two terminals and a control input, whereby application of a signal to the control input of a given one of the fourth plurality of transfer gates enables opening and closing of a connection between the two terminals of the given one of the fourth plurality of transfer gates;

c) interconnecting a second signal source to a given one of the at least one fourth plurality of one-hot outputs via the second plurality of transfer gates by forming a fourth plurality of series paths between the first signal source and the given one of the at least one fourth plurality of one-hot outputs, each of the fourth plurality of series paths comprising a subset of the fourth plurality of transfer gates which are connected via their terminals; and d) connecting ones of the sixth and at least one seventh plurality of one-hot outputs to ones of the control inputs of the fourth plurality of transfer gates by:
   i) connecting one of the sixth plurality of one-hot outputs and one of each of the at least one seventh pluralities of one-hot outputs to the control inputs of the transfer gates forming a given one of the fourth plurality of series paths; and
   ii) connecting a different subset of the sixth and at least one seventh plurality of one-hot outputs to the control inputs of transfer gates in each series path of the fourth plurality of series paths.

8. A method as in claim 1, further comprising:
a) providing at least one second plurality of one-hot outputs which is indicative of a number of like signals in M data bits;
b) providing a second plurality of transfer gates, each of the second plurality of transfer gates comprising two terminals and a control input, whereby application of a signal to the control input of a given one of the second plurality of transfer gates enables opening and closing of a connection between the two terminals of the given one of the second plurality of transfer gates;
c) interconnecting the first plurality of one-hot outputs to a third plurality of one-hot outputs via the second plurality of transfer gates by forming a second plurality of series paths between the first and third pluralities of one-hot outputs, each of the second plurality of series paths comprising a subset of the second plurality of transfer gates which are connected via their terminals; and
d) connecting ones of the at least one second plurality of one-hot outputs to ones of the control inputs of the second plurality of transfer gates by:
   i) connecting one of each of the at least one second plurality of one-hot outputs to the control inputs of the transfer gates forming a given one of the second plurality of series paths; and
   ii) connecting a different subset of the at least one second plurality of one-hot outputs to the control inputs of transfer gates in each series path of the second plurality of series paths.

9. A method as in claim 8, wherein providing the at least one second plurality of one-hot outputs which is indicative of a number of like signals in M data bits comprises:
a) providing a second plurality of signal paths comprising a true signal path and a complementary signal path for each of the M data bits;
b) providing a third plurality of transfer gates, each of the third plurality of transfer gates comprising two terminals and a control input, whereby application of a signal to the control input of a given one of the third plurality of transfer gates enables opening and closing of a connection between the two terminals of the given one of the third plurality of transfer gates;

c) interconnecting the first signal source to the second plurality of one-hot outputs via the third plurality of transfer gates by forming a third plurality of series paths between the first signal source and the second plurality of one-hot outputs, each of the third plurality of series paths comprising a subset of the third plurality of transfer gates which are connected via their terminals; and d) connecting ones of the third plurality of signal paths to ones of the control inputs of the third plurality of transfer gates by:
   i) connecting a different one of the second plurality of signal paths to the control input of each transfer gate forming a given one of the third plurality of series paths;
   ii) connecting a different subset of the second plurality of signal paths to the control inputs of transfer gates in each series path of the third plurality of series paths; and
   iii) connecting a same ratio of true signal paths for the M data bits to complementary signal paths for the M data bits to the control inputs of transfer gates in each series path of the third plurality of series paths which interconnects the first signal source to a given one of the second plurality of one-hot outputs.

10. A method as in claim 8, wherein providing the at least one second plurality of one-hot outputs which is indicative of a number of like signals in M data bits comprises:
a) providing a second plurality of signal paths comprising a true signal path and a complementary signal path for each of the M data bits;
b) providing a third plurality of transfer gates, each of the third plurality of transfer gates comprising two terminals and a control input, whereby application of a signal to the control input of a given one of the third plurality of transfer gates enables opening and closing of a connection between the two terminals of the given one of the third plurality of transfer gates;
c) interconnecting a second signal source to the second plurality of one-hot outputs via the third plurality of transfer gates by forming a third plurality of series paths between the first signal source and the second plurality of one-hot outputs, each of the third plurality of series paths comprising a subset of the third plurality of transfer gates which are connected via their terminals; and
d) connecting ones of the third plurality of signal paths to ones of the control inputs of the third plurality of transfer gates by:
   i) connecting a different one of the second plurality of signal paths to the control input of each transfer gate forming a given one of the third plurality of series paths;
   ii) connecting a different subset of the second plurality of signal paths to the control inputs of transfer gates in each series path of the third plurality of series paths; and
   iii) connecting a same ratio of true signal paths for the M data bits to complementary signal paths for the M data bits to the control inputs of transfer gates in each series path of the third plurality of series paths which interconnects the first signal source to a given one of the second plurality of one-hot outputs.

11. A method as in claim 1, wherein said first signal source is connected to a first voltage rail, and said first plurality of series paths is precharged to a voltage level of a second voltage rail.

12. A method as in claim 1, further comprising converting said first plurality of one-hot outputs to a binary encoded output.

13. A method as in claim 1, further comprising:
providing a first plurality of buffers; and
connecting ones of the first plurality of one-hot outputs to ones of the first plurality of buffers.

14. A method as in claim 13, wherein said buffers comprise inverters.

15. A device for counting a number of like signals in a plurality of data bits, comprising:
a) a first plurality of signal paths comprising a true signal path and a complementary signal path for each of N data bits; and
b) a first plurality of transfer gates, each of the first plurality of transfer gates comprising two terminals and a control input, whereby application of a signal to the control input of a given one of the first plurality of transfer gates enables opening and closing of a connection between the two terminals of the given one of the first plurality of transfer gates; wherein:
c) said first plurality of transfer gates interconnect a first signal source and a first plurality of one-hot outputs by forming a first plurality of series paths between the first signal source and the first plurality of one-hot outputs, each of the first plurality of series paths comprising a subset of the first plurality of transfer gates which are connected via their terminals; and
d) ones of the first plurality of signal paths are connected to ones of the control inputs of the first plurality of transfer gates as follows:
i) a different one of the first plurality of signal paths is connected to the control input of each transfer gate forming a given one of the first plurality of series paths;
ii) a different subset of the first plurality of signal paths is connected to the control inputs of transfer gates in each series path of the first plurality of series paths; and
iii) a same ratio of true signal paths for the N data bits to complementary signal paths for the N data bits is connected to the control inputs of transfer gates in each series path of the first plurality of series paths which interconnects the first signal source to a given one of the first plurality of one-hot outputs.

16. A device as in claim 15, wherein said each of said first plurality of transfer gates comprises a CMOS transistor.

17. A device as in claim 15, wherein said first plurality of signal paths comprises four true signal paths.

18. A device as in claim 15, further comprising a first plurality of precharge gates, each of the first plurality of precharge gates comprising a first terminal, a second terminal and a control input, whereby application of a signal to the control input of a given one of the first plurality of precharge gates enables opening and closing of a connection between the first terminal and the second terminal of the given one of the first plurality of precharge gates, wherein said first plurality of precharge gates interconnect said first plurality of series paths and a first voltage rail as follows:
a) the first terminal of each of the first plurality of precharge gates is connected to the first voltage rail;
b) a different one of the first plurality of series paths is connected to the second terminal of each of the first plurality of precharge gates; and
c) the control input of each of the first plurality of precharge gates is connected to a clock signal.

19. A device as in claim 15, further comprising a one-hot to binary encoder wherein said encoder comprises a plurality of inputs, one for each of said first plurality of one-hot outputs, and a plurality of outputs for indicating a binary encoded representation of a value appearing on said first plurality of one-hot outputs, ones of said plurality of inputs being connected to ones of said first plurality of one-hot outputs.

20. A device as in claim 15, further comprising:
a) at least one second plurality of one-hot outputs which is indicative of a number of like signals in M data bits;
b) a second plurality of transfer gates, each of the second plurality of transfer gates comprising two terminals and a control input, whereby application of a signal to the control input of a given one of the second plurality of transfer gates enables opening and closing of a connection between the two terminals of the given one of the second plurality of transfer gates;
c) a third plurality of one-hot outputs connected to said first signal source via the second plurality of transfer gates by forming a second plurality of series paths between the first signal source and the third plurality of one-hot outputs, each of the second plurality of series paths comprising a subset of the second plurality of transfer gates which are connected via their terminals; and
d) ones of the first and at least one second plurality of one-hot outputs which are connected to ones of the control inputs of the second plurality of transfer gates as follows:
i) a different one of the first plurality of one-hot outputs and one of each of the at least one second pluralities of one-hot outputs is connected to the control input of each transfer gate forming a given one of the second plurality of series paths; and
ii) a different subset of the first and at least one second plurality of one-hot outputs is connected to the control inputs of transfer gates in each series path of the second plurality of series paths.

21. A device as in claim 20, further comprising:
a) at least one fourth plurality of one-hot outputs which is indicative of a number of like signals in L data bits;
b) a third plurality of transfer gates, each of the third plurality of transfer gates comprising two terminals and a control input, whereby application of a signal to the control input of a given one of the third plurality of transfer gates enables opening and closing of a connection between the two terminals of the given one of the third plurality of transfer gates; wherein
c) said third plurality of transfer gates interconnect the third plurality of one-hot outputs and a fifth plurality of one-hot outputs by forming a third plurality of series paths between the third and fifth pluralities of one-hot outputs, each of the third plurality of series paths comprising a subset of the third plurality of transfer gates which are connected via their terminals; and
d) ones of the at least one fourth plurality of one-hot outputs are connected to ones of the control inputs of the third plurality of transfer gates as follows:
i) a different one of each of the at least one fourth plurality of one-hot outputs is connected to the control input of each transfer gate forming a given one of the third plurality of series paths; and
ii) a different subset of the at least one fourth plurality of one-hot outputs is connected to the control inputs of transfer gates in each series path of the third plurality of series paths.

22. A device as in claim 15, further comprising:
a) at least one second plurality of one-hot outputs which is indicative of a number of like signals in M data bits;
b) a second plurality of transfer gates, each of the second plurality of transfer gates comprising two terminals and a control input, whereby application of a signal to the control input of a given one of the second plurality of transfer gates enables opening and closing of a connection between the two terminals of the given one of the second plurality of transfer gates; wherein:
c) said second plurality of transfer gates interconnect the first plurality of one-hot outputs and a third plurality of one-hot outputs by forming a second plurality of series paths between the first and third pluralities of one-hot outputs, each of the second plurality of series paths comprising a subset of the second plurality of transfer gates which are connected via their terminals; and
d) ones of the at least one second plurality of one-hot outputs are connected to ones of the control inputs of the second plurality of transfer gates as follows:

i) a different one of each of the at least one second plurality of one-hot outputs is connected to the control input of each transfer gate forming a given one of the second plurality of series paths; and
ii) a different subset of the at least one second plurality of one-hot outputs is connected to the control inputs of transfer gates in each series path of the second plurality of series paths.

23. A method of producing a one-hot encoded output comprising Q data bits from a one-hot encoded input comprising Q+1 data bits, comprising:

dropping one of said input data bits representing a unique number;

transferring a value from each of a remainder of said input data bits to ones of said output data bits, wherein said unique number is represented in said output data bits by setting all of said output data bits to a same value.

* * * * *